(12) United States Patent  (10) Patent No.: US 8,022,745 B1
Dening et al.  (45) Date of Patent: Sep. 20, 2011

(54) HIGH VOLTAGE SWITCH USING MULTIPLE CASCODE CIRCUITS

(75) Inventors: David C. Dening, Stokesdale, NC (US); Philippe Gorisse, Midi-Pyrennees (FR)

(73) Assignee: RF Micro Devices, Inc., Greenboro, NC (US)

( * ) Notice: Subject to any disclaimer, the term of this patent is extended or adjusted under 35 U.S.C. 154(b) by 650 days.

(21) Appl. No.: 11/856,220

(22) Filed: Sep. 17, 2007

(51) Int. Cl.
*H03K 5/08* (2006.01)

(52) U.S. Cl. ........ 327/309; 327/318; 327/319; 327/320; 327/326

(58) Field of Classification Search .................. 327/309, 327/318–320, 326
See application file for complete search history.

(56) References Cited

U.S. PATENT DOCUMENTS

| | | | | |
|---|---|---|---|---|
| 5,519,348 | A * | 5/1996 | Tanoi | 327/205 |
| 6,654,275 | B2 * | 11/2003 | Forbes | 365/154 |
| 7,233,531 | B2 * | 6/2007 | Forbes | 365/189.11 |

OTHER PUBLICATIONS

Dickson, John F., "On-Chip high-Voltage Generation in MNOS Integrated Circuits Using an Imrpvoed Voltage Multiplier Technique," IEEE Journal of Solid-State Circuits, Jun. 1976, pp. 374-378, vol. SC-11, No. 3, IEEE.

* cited by examiner

*Primary Examiner* — Kenneth B. Wells
(74) *Attorney, Agent, or Firm* — Withrow & Terranova, P.L.L.C.

(57) ABSTRACT

The present invention is a high voltage semiconductor switch that is formed from a chain of series coupled cascode circuits. In one embodiment, the switch may be a single-throw configuration coupled between an output and a direct current (DC) reference. In an alternate embodiment, the switch may be a double-throw configuration such that the output is switched between either a first DC reference or a second DC reference, such as ground. Each cascode circuit may have clamp circuits to prevent over voltage during switching transitions. The series coupled cascode circuits may be formed using discrete components or on a silicon-on-insulator (SOI) wafer, which may have a Silicon Dioxide insulator layer or a Sapphire insulator layer.

27 Claims, 15 Drawing Sheets

US 8,022,745 B1

HIGH VOLTAGE SWITCH USING MULTIPLE CASCODE CIRCUITS

FIELD OF THE INVENTION

The present invention relates to high voltage switch circuits, which may be used in radio frequency (RF) switches.

BACKGROUND OF THE INVENTION

Traditional semiconductor processes for integrated circuits may produce transistor elements capable of switching voltages on the order of about six volts; however, circuit requirements may have needs for switching voltages much larger, such as on the order of 100 volts. For example, a microelectromechanical system (MEMS) switch may require an actuation voltage between 60 volts and 100 volts. A traditional semiconductor wafer may have a device layer in direct contact with a substrate forming a P-N junction; therefore, multiple devices that are formed using the device layer are coupled to each other through the P-N junctions via the substrate, and voltages between the multiple devices are thus restricted to reverse voltage ratings of the P-N junctions to the substrate, which may be on the order of twenty to thirty volts.

A silicon-on-insulator (SOI) wafer uses an insulating layer between the device layer and the substrate; therefore, multiple devices that are formed using the device layer may be isolated from each other, which may support large voltages between devices. Thus, a need exists for a high voltage semiconductor switch formed using multiple semiconductor devices.

SUMMARY OF THE INVENTION

The present invention is a high voltage semiconductor switch that is formed from a chain of series coupled cascode circuits. In one embodiment, the switch may be a single-throw configuration coupled between an output and a direct current (DC) reference. In an alternate embodiment, the switch may be a double-throw configuration such that the output is switched between either a first DC reference or a second DC reference, such as ground. Each cascode circuit may have clamp circuits to prevent over voltage during switching transitions. The series coupled cascode circuits may be formed using discrete components or on a silicon-on-insulator (SOI) wafer, which may have a Silicon Dioxide insulator layer or a Sapphire insulator layer.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a high voltage semiconductor switch that is formed from a chain of series coupled cascode circuits. In one embodiment, the switch may be a single-throw configuration coupled between an output and a direct current (DC) reference. In an alternate embodiment, the switch may be a double-throw configuration such that the output is switched between either a first DC reference or a second DC reference, such as ground. Each cascode circuit may have clamp circuits to prevent over voltage during switching transitions. The series coupled cascode circuits may be formed using discrete components or on a silicon-on-insulator (SOI) wafer, which may have a Silicon Dioxide insulator layer or a Sapphire insulator layer.

Figure 1:
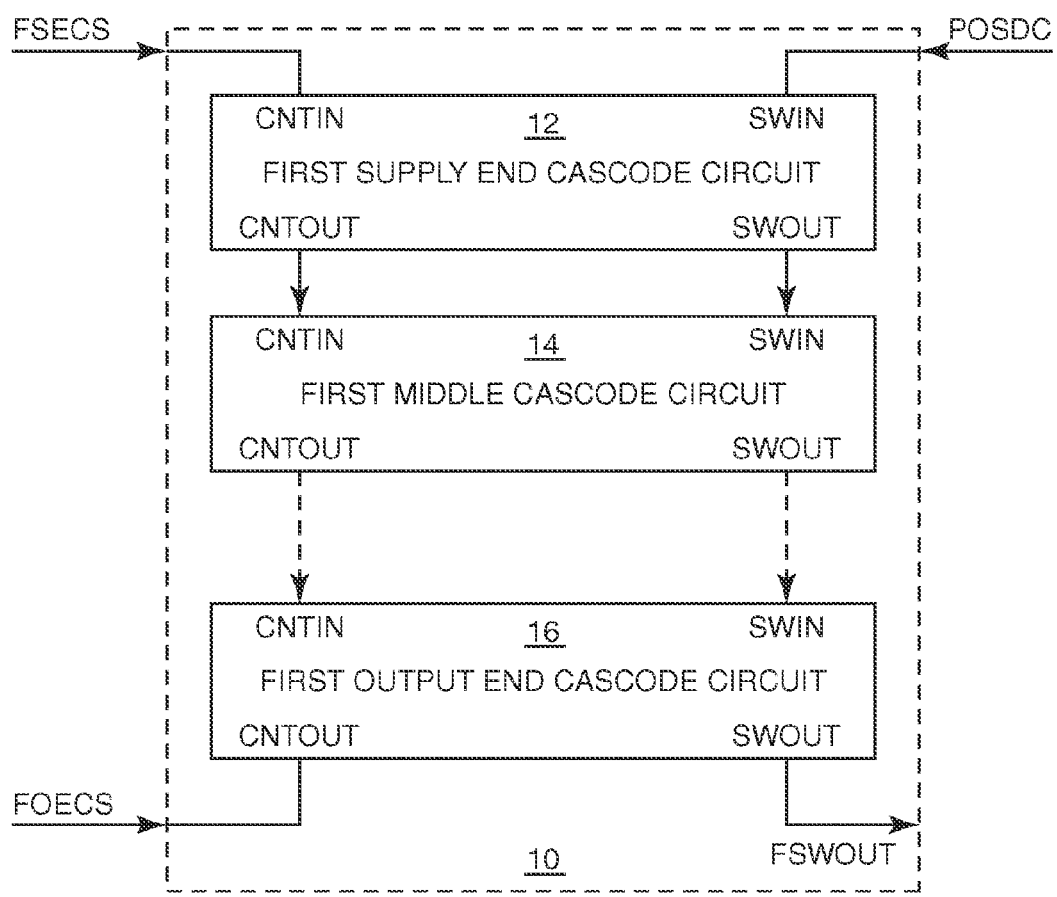
FIG. 1 shows a first cascode switch according to a first embodiment of the present invention.

FIG. 1 shows a first cascode switch 10 according to a first embodiment of the present invention. The first cascode switch 10 includes a first supply end cascode circuit 12, a first middle cascode circuit 14, and a first output end cascode circuit 16 coupled in series. Each of the first cascode circuits 12, 14, 16 has a control input CNTIN, a control output CNTOUT, a switching input SWIN, and a switching output SWOUT. The control input CNTIN of the first supply end cascode circuit 12 receives a first supply end control signal FSECS. The switching input SWIN of the first supply end cascode circuit 12 receives a positive DC reference signal POSDC. The control output CNTOUT of the first supply end cascode circuit 12 is coupled to the control input CNTIN of the first middle cascode circuit 14, and the switching output SWOUT of the first supply end cascode circuit 12 is coupled to the switching input SWIN of the first middle cascode circuit 14. The control output CNTOUT of the first middle cascode circuit 14 is coupled to the control input CNTIN of the first output end cascode circuit 16, and the switching output SWOUT of the first middle cascode circuit 14 is coupled to the switching input SWIN of the first output end cascode circuit 16. The control output CNTOUT of the first output end cascode circuit 16 receives a first output end control signal FOECS, and the switching output SWOUT of the first output end cascode circuit 16 provides a first switch output FSWOUT. The first supply and output end control signals FSECS, FOECS select either an open state or a closed state for the first cascode switch 10. When in the closed state, the first switch output FSWOUT is connected to the positive DC reference signal POSDC, and in the open state there is a high impedance between the first switch output FSWOUT and the positive DC reference signal POSDC. Alternate embodiments of the present invention may have any number of first cascode circuits based on the voltage handling capacity of each cascode circuit and the voltage to be switched between the first switch output FSWOUT and the positive DC reference signal POSDC. The first cascode switch 10 may include at least six first cascode circuits. In an exemplary embodiment of the present invention, the first cascode switch 10 includes greater than ten first cascode circuits. Alternate embodiments of the present invention may have any number of first cascode circuits coupled in series. A voltage of the positive DC reference signal POSDC may be intended to be more positive than a voltage at the first switch output FSWOUT.

Figure 2:
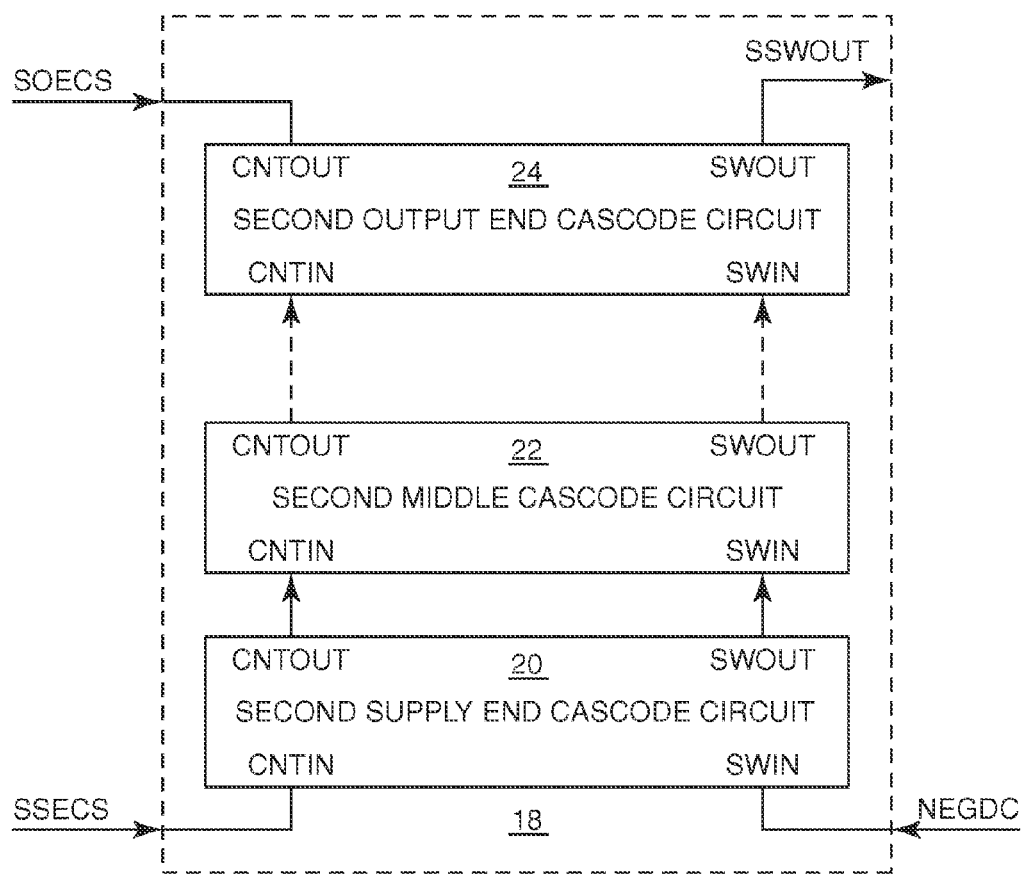
FIG. 2 shows a second cascode switch according to a second embodiment of the present invention.

FIG. 2 shows a second cascode switch 18 according to a second embodiment of the present invention. The second cascode switch 18 is similar to the first cascode switch 10 except that instead of a positive DC reference signal POSDC, the second cascode switch 18 has a negative DC reference signal NEGDC and a second switch output SSWOUT, such that a voltage of the negative DC reference signal NEGDC is intended to be more negative than a voltage at the second switch output SSWOUT. The second cascode switch 18 includes a second supply end cascode circuit 20, a second middle cascode circuit 22, and a second output end cascode circuit 24 coupled in series. Similar to the first cascode circuits 12, 14, 16, each of the second cascode circuits 20, 22, 24 has a control input CNTIN, a control output CNTOUT, a switching input SWIN, and a switching output SWOUT. The control input CNTIN of the second supply end cascode circuit 20 receives a second supply end control signal SSECS, and the switching input SWIN of the second supply end cascode circuit 20 receives the negative DC reference signal NEGDC. The control output CNTOUT of the second supply end cascode circuit 20 is coupled to the control input CNTIN of the second middle cascode circuit 22, and the switching output SWOUT of the second supply end cascode circuit 20 is coupled to the switching input SWIN of the second middle cascode circuit 22. The control output CNTOUT of the second middle cascode circuit 22 is coupled to the control input CNTIN of the second output end cascode circuit 24, and the switching output SWOUT of the second middle cascode circuit 22 is coupled to the switching input SWIN of the second output end cascode circuit 24. The control output CNTOUT of the second output end cascode circuit 24 receives a second output end control signal SOECS, and the switching output SWOUT of the second output end cascode circuit 24 is coupled to the second switch output SSWOUT. The second supply end and output end control signals SSECS, SOECS select either an open state or a closed state. During the closed state, the second switch output SSWOUT is connected to the negative DC reference signal NEGDC, and during the open state, there is a high impedance between the second switch output SSWOUT and the negative DC reference signal NEGDC. Alternate embodiments of the present invention may have any number of second cascode circuits coupled in series. Either the positive or negative DC reference signal POSDC, NEGDC may be provided by ground.

Figure 3:
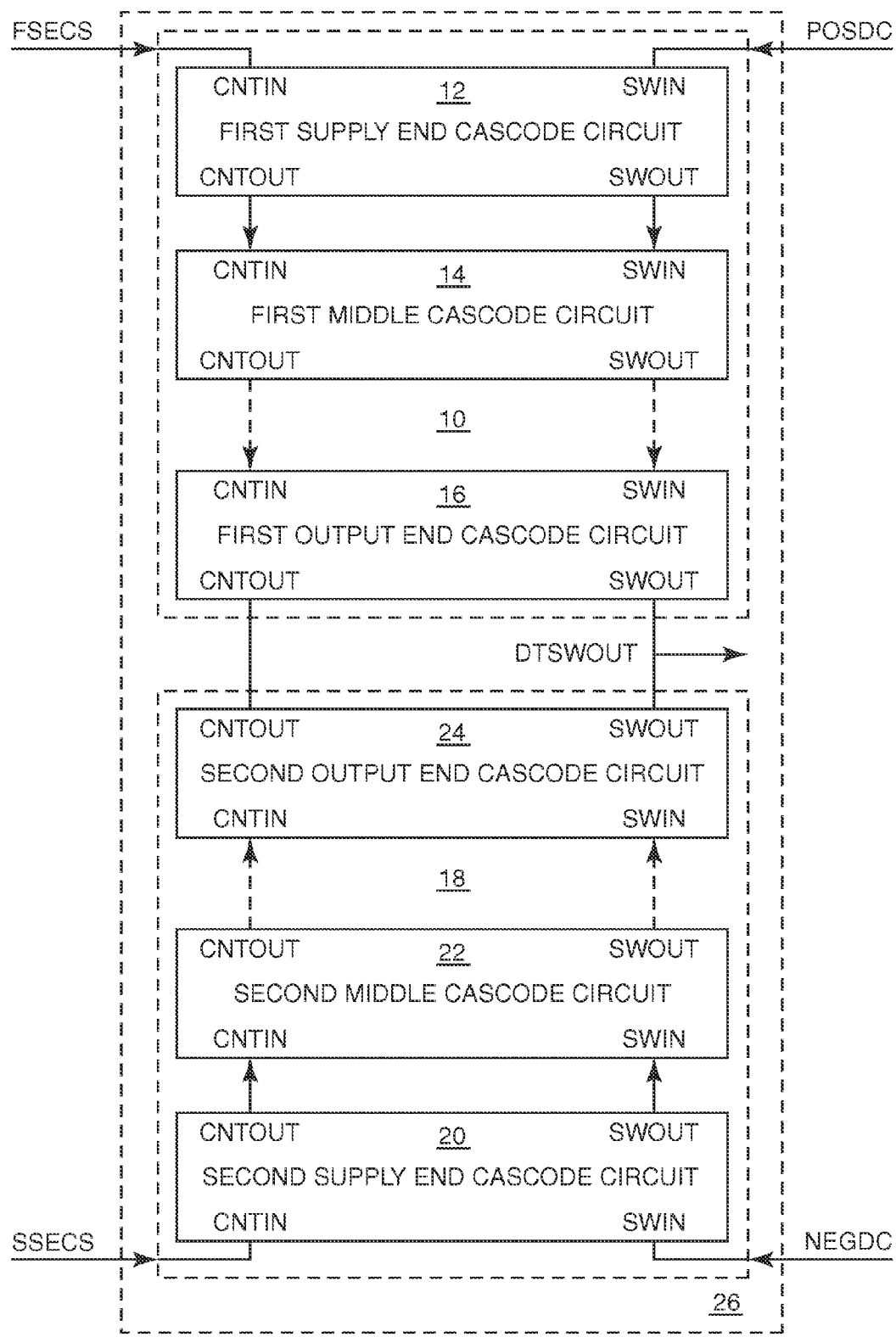
FIG. 3 shows a double-throw cascode switch according to a third embodiment of the present invention.

FIG. 3 shows a double-throw cascode switch 26 according to a third embodiment of the present invention. The first cascode switch 10 and the second cascode switch 18 are coupled together to form the double-throw cascode switch 26. The control outputs CNTOUT of the first and second output end cascode circuits 16, 24 are coupled together, and the switching outputs SWOUT of the first and second output end cascode circuits 16, 24 are coupled together to provide a double-throw switch output DTSWOUT. The control output CNTOUT of the second output end cascode circuit 24 provides the first output end control signal FOECS, and the control output CNTOUT of the first output end cascode circuit 16 provides the second output end control signal SOECS. When the first and second supply end control signals FSECS, SSECS are in a first state, the first cascode switch 10 is in its closed state and the second cascode switch 18 is in its open state. When the first and second supply end control signals FSECS, SSECS are in a second state the first cascode switch 10 is in its open state and the second cascode switch 18 is in its closed state.

Figure 4:
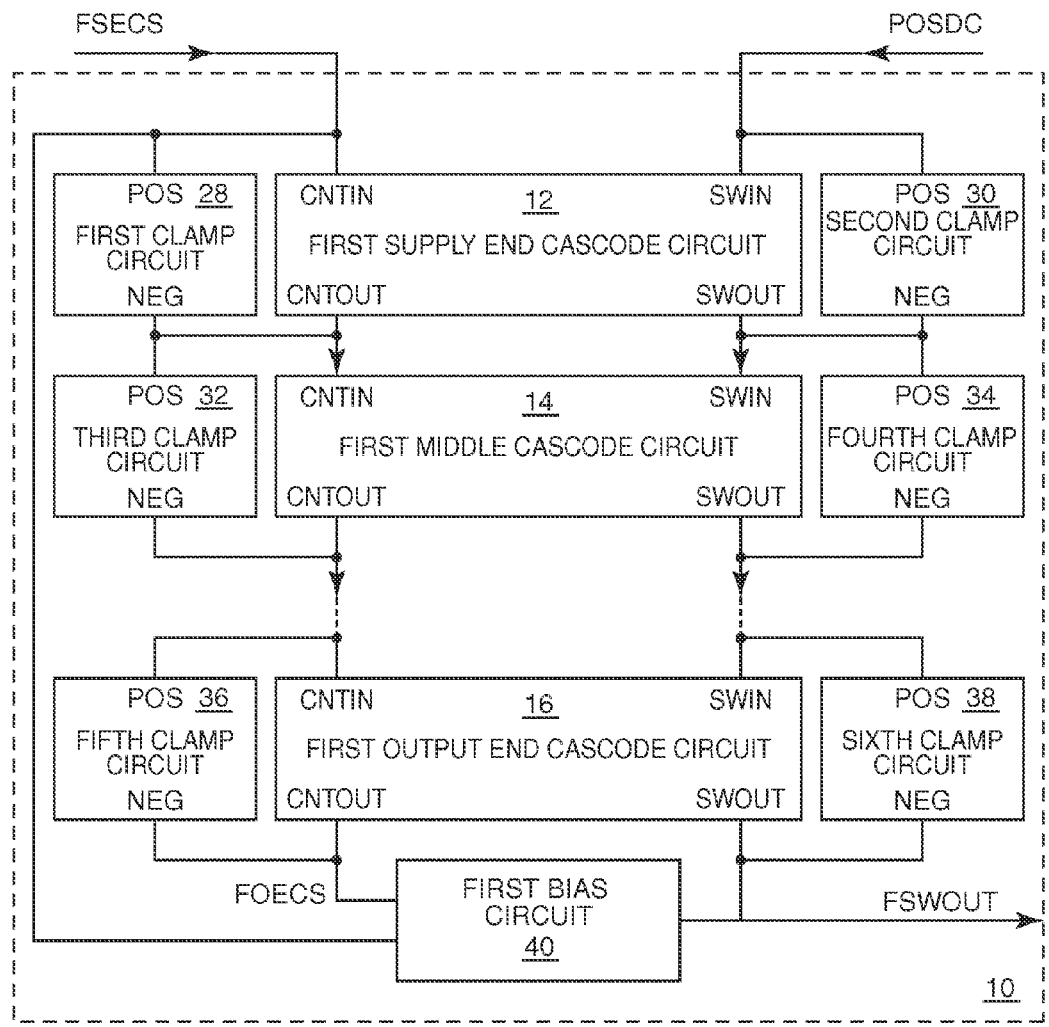
FIG. 4 shows clamp circuits and a first bias circuit added to the first cascode switch illustrated in FIG. 1.

FIG. 4 shows clamp circuits 28, 30, 32, 34, 36, 38 and a first bias circuit 40 added to the first cascode switch 10 illustrated in FIG. 1. Positive inputs POS of the first, third, and fifth clamp circuits 28, 32, 36 are coupled to the control inputs CNTIN of the first cascode circuits 12, 14, 16, and negative inputs NEG to the first, third, and fifth clamp circuits 28, 32, 36 are coupled to the control outputs CNTOUT of the first cascode circuits 12, 14, 16. Positive inputs POS of the second, fourth, and sixth clamp circuits 30, 34, 38 are coupled to the switching input SWIN of the first cascode circuits 12, 14, 16, and negative inputs NEG of the second, fourth, and sixth clamp circuits 30, 34, 38 are coupled to the switching outputs SWOUT of the first cascode circuits 12, 14, 16. The clamp circuits 28, 30, 32, 34, 36, 38 limit voltages between the control inputs CNTIN and the control outputs CNTOUT, and the voltage between the switching inputs SWIN and the switching outputs SWOUT of the first cascode circuits 12, 14, 16 to a clamp breakdown voltage during transitions from either the closed state to the open state or from the open state to the closed state of the first cascode switch 10. When the voltage at the positive input POS minus the voltage at the negative input NEG exceeds the clamp breakdown voltage, the clamp circuits 28, 30, 32, 34, 36, 38 conduct current to limit the voltage between the positive and negative inputs POS, NEG. A clamp circuit 28, 30, 32, 34, 36, 38 is in a clamping state when conducting current. When the voltage at the positive input POS minus the voltage at the negative input NEG of the clamp circuits 28, 30, 32, 34, 36, 38 is less than a maximum clamp operating voltage, the clamp circuits 28, 30, 32, 34, 36, 38 present a high impedance between the positive and negative inputs POS, NEG. A clamp circuit 28, 30, 32, 34, 36, 38 is in a non-clamping state when presenting the high input impedance.

In an exemplary embodiment of the present invention the maximum clamp operating voltage ranges between three volts DC and seven volts DC, and the clamp breakdown voltage ranges between four volts DC and nine volts DC. The first bias circuit 40 provides the first output end control signal FOECS to the control output CNTOUT of the first output end cascode circuit 16 such that the relationship between the first output end control signal FOECS and a magnitude of the signal at the first switch output FSWOUT is proper for both the open state and the closed state of the first cascode switch 10. The first bias circuit 40 determines the state of the first cascode switch 10 from the first supply end control signal FSECS.

Figure 5:
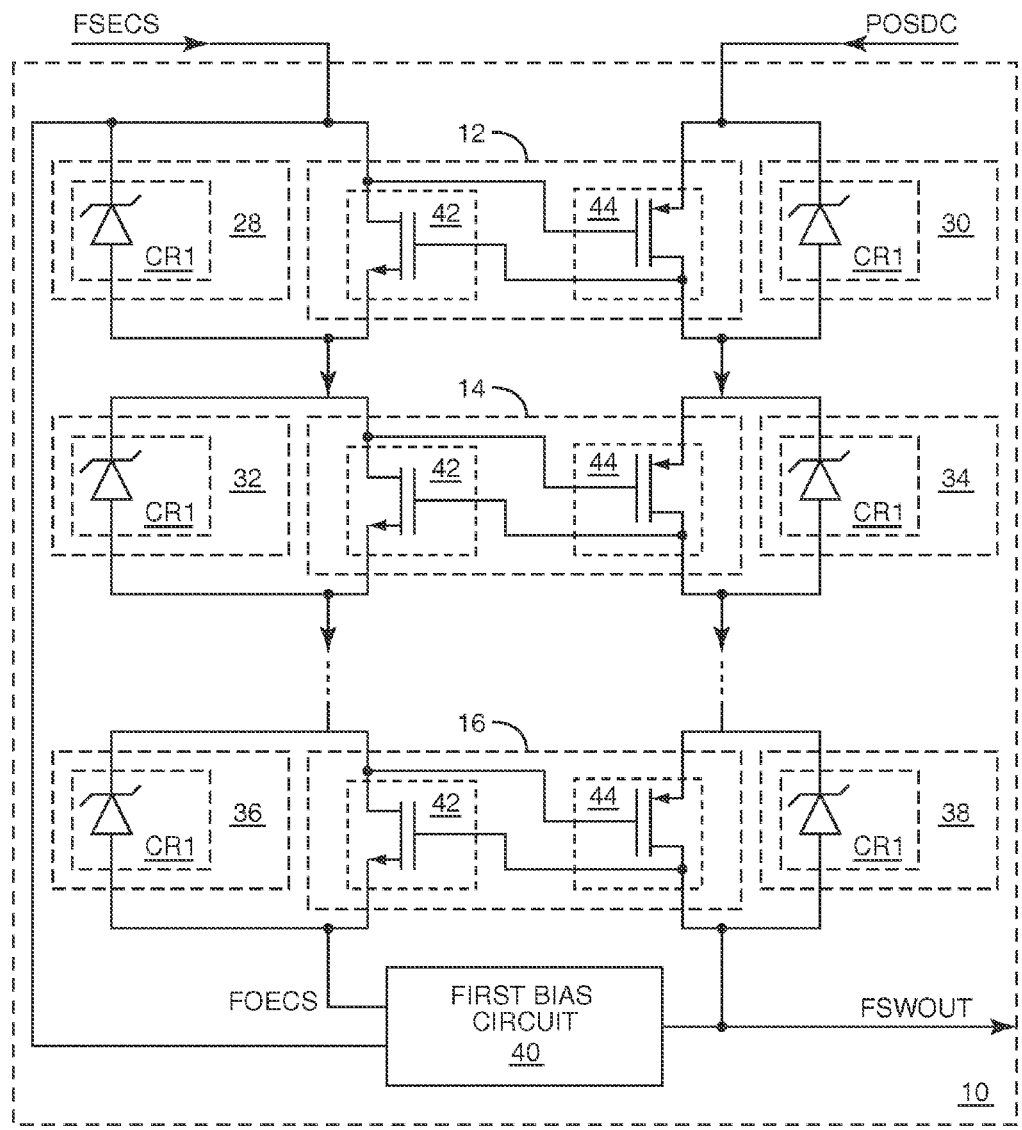
FIG. 5 shows details of the first cascode circuits and a first embodiment of the clamp circuits illustrated in FIG. 4.

FIG. 5 shows details of the first cascode circuits 12, 14, 16 and a first embodiment of the clamp circuits 28, 30, 32, 34, 36, 38 illustrated in FIG. 4. Each of the clamp circuits 28, 30, 32, 34, 36, 38 includes a zener diode element CR1 such that a cathode of the zener diode element CR1 is coupled to the positive input POS, and an anode of the zener diode element CR1 is coupled to the negative input NEG. A zener voltage of the zener diode element CR1 is approximately equal to the clamp breakdown voltage. Each of the first cascode circuits 12, 14, 16 has a first N-channel field effect transistor (FET) element 42 and a first P-channel FET element 44 connected in a cascode arrangement. A source of the first N-channel FET element 42 provides the control output CNTOUT, and a source of the first P-channel FET element 44 provides the switching input SWIN. A gate of the first P-channel FET element 44 is coupled to a drain of the first N-channel FET element 42, which provides the control input CNTIN. A gate of the first N-channel FET element 42 is coupled to a drain of the first P-channel FET element 44, which provides the switching output SWOUT. In one embodiment of the present invention, the FET elements 42, 44 are metal oxide semiconductor field effect transistor (MOSFET) elements.

Figure 6:
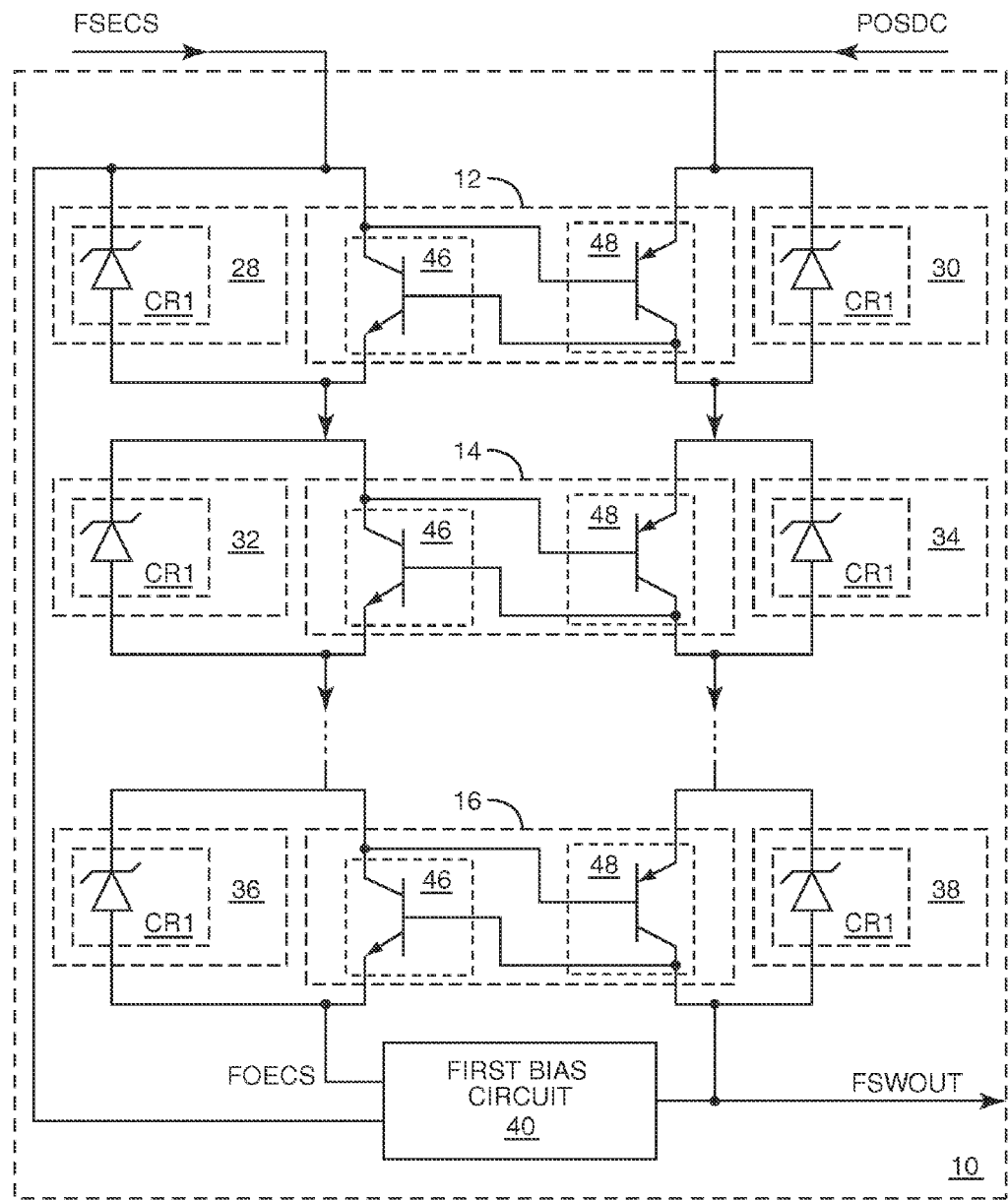
FIG. 6 shows an alternate embodiment of the first cascode circuits illustrated in FIG. 4.

FIG. 6 shows an alternate embodiment of the first cascode circuits 12, 14, 16 illustrated in FIG. 4. Each of the first cascode circuits 12, 14, 16 includes a first NPN bipolar transistor element 46 and a first PNP bipolar transistor element 48 coupled in a cascode arrangement. An emitter of the first NPN bipolar transistor element 46 provides the control output CNTOUT, and an emitter of the first PNP bipolar transistor element 48 provides the switching input SWIN. A base of the first PNP bipolar transistor element 48 is coupled to a collector of the first NPN bipolar transistor element 46, which provides the control input CNTIN. A base of the first NPN bipolar transistor element 46 is coupled to a collector of the first PNP bipolar transistor element 48, which provides the switching output SWOUT.

Figure 7:
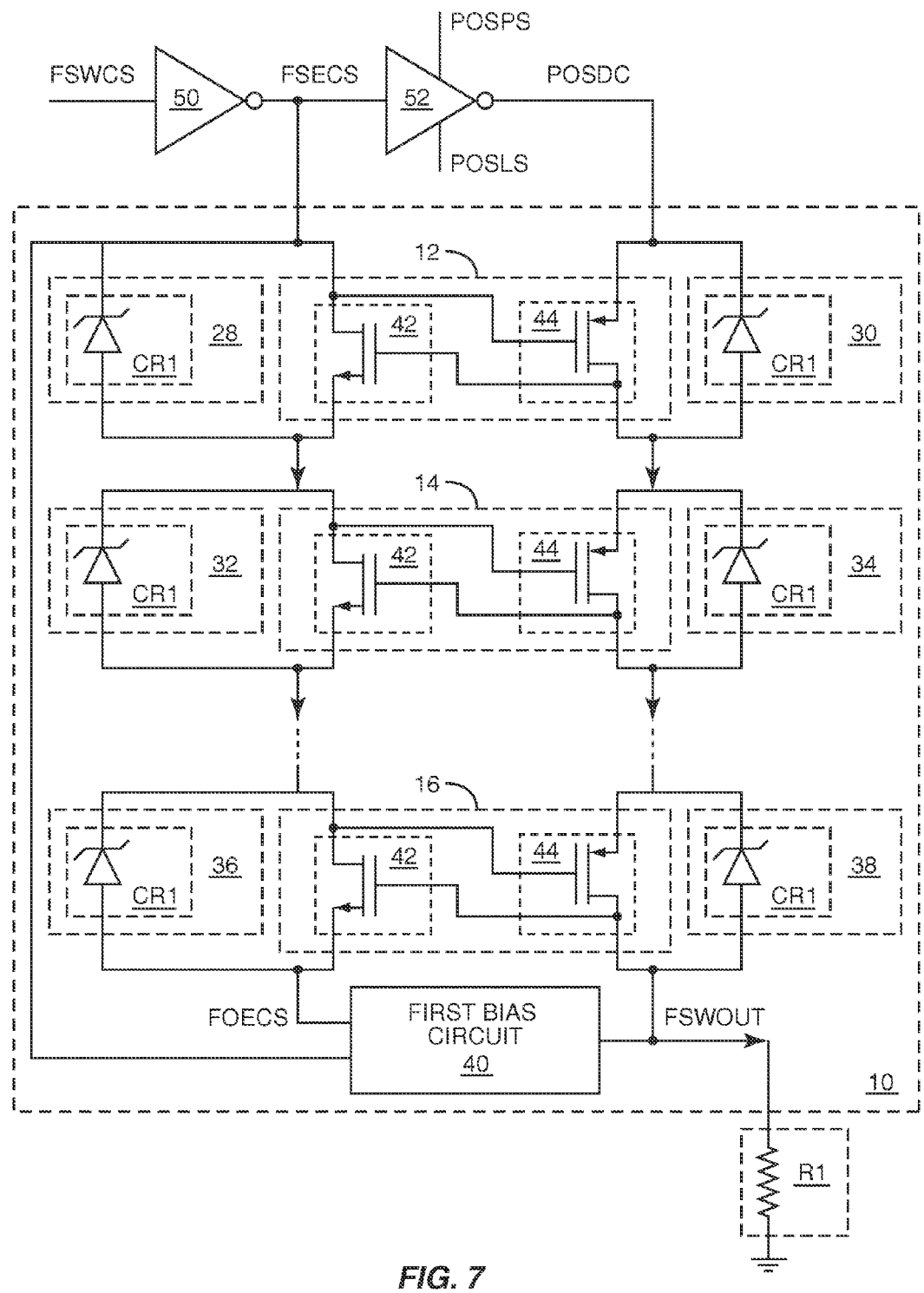
FIG. 7 shows a first inverter and a second inverter added to the first cascode switch illustrated in FIG. 5.

FIG. 7 shows a first inverter 50 and a second inverter 52 added to the first cascode switch 10 illustrated in FIG. 5. A first switch control signal FSWCS feeds the first inverter 50, which provides the first supply end control signal FSECS to the first cascode switch 10 and the second inverter 52. The second inverter 52 provides the positive DC reference signal POSDC to the first cascode switch 10. The first and second inverters 50, 52 are powered by a positive DC power supply signal POSPS and a positive DC logic supply signal POSLS. In one embodiment of the present invention, the positive DC power supply signal POSPS may be between sixty and one-hundred volts above ground and the positive DC logic supply signal POSLS may be between three and seven volts below the positive power DC supply signal POSPS. In an alternate embodiment of the present invention, the positive DC power supply signal POSPS may be between fifty and two-hundred volts above ground. The first switch control signal FSWCS is high when a voltage of the first switch control signal FSWCS is approximately equal to the positive DC power supply signal POSPS, and the first switch control signal FSWCS is low when the voltage of the first switch control signal FSWCS is approximately equal to the positive DC logic supply signal POSLS. The first cascode switch 10 is in its open state when the first switch control signal FSWCS is low, which causes the first supply end control signal FSECS to be high, in turn causing the positive DC reference signal POSDC to be low.

With its gate high and its source low, the first P-channel FET element 44 of the first supply end cascode circuit 12 is off.

The first switch output FSWOUT is coupled to ground through a first resistive element R1; therefore, since the first cascode switch 10 is in its open state, the voltage between the positive DC reference signal POSDC and ground will be divided approximately equally between the first cascode circuits 12, 14, 16. Since the first cascode circuit 10 is in its open state, the voltage of the first output end control signal FOECS will be higher than a voltage of the first switch output FSWOUT; therefore, the gate voltage is less than the source voltage of the first N-channel FET element 42 of the first output end cascode circuit 16, which turns off the first N-channel FET element 42. Since the first cascode switch 10 is in its open state, the voltage between the first supply end control signal FSECS and the first output end control signal FOECS will be divided approximately equal between the first cascode circuits 12, 14, 16, causing the voltages at the gates of all of the first P-channel FET elements 44 to be higher than the voltages at the sources of all of the first P-channel FET elements 44, which turns off all of the first P-channel FET elements 44. Likewise, since the voltages at the gates of the first N-channel FET elements 42 is lower than the voltages at the sources of all of the first N-channel FET elements 42, all of the first N-channel FET elements 42 are off.

When the first switch control signal FSWCS transitions to a high, which places the first cascode switch 10 in its closed state, the first supply end control signal FSECS then goes low, which causes the positive DC reference signal POSDC to go high, causing the voltage at the source to be higher than the voltage at the gate of the first P-channel FET element 44 of the first supply end cascode circuit 12, which turns on the first P-channel FET element 44. When the first P-channel FET element 44 of the first supply end cascode circuit 12 is turned on, the gate of the first N-channel FET element 42 of the first supply end cascode circuit 12 goes higher than its drain, thereby turning it on. By turning on both FET elements 42, 44 in the first supply end cascode circuit 12, each subsequent cascode circuit is turned on until all of the cascode circuits are turned on. When the first cascode switch 10 is in its closed state, the first bias circuit 40 must provide a first output end control signal FOECS, which has a voltage that is less than the voltage at the first switch output FSWOUT.

Figure 8:
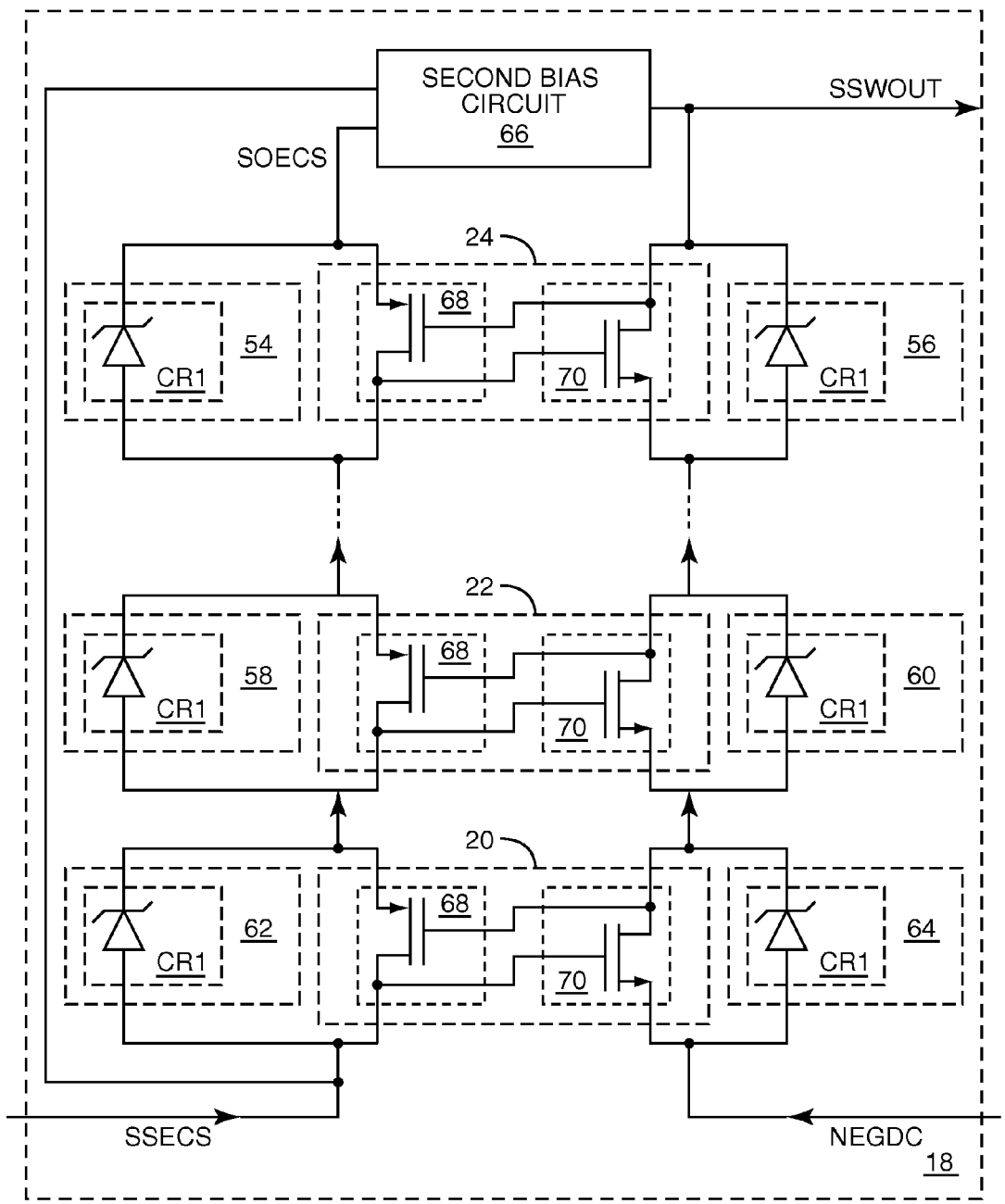
FIG. 8 shows details of the second cascode circuits illustrated in FIG. 2, and adds a first embodiment of clamp circuits and a second bias circuit.

FIG. 8 shows details of the second cascode circuits 20, 22, 24 illustrated in FIG. 2, and adds a first embodiment of clamp circuits 54, 56, 58, 60, 62, 64 and a second bias circuit 66. Similarly to the first cascode switch 10, the second cascode switch 18 has clamp circuits 54, 56, 58, 60, 62, 64 coupled across each of the second cascode circuits 20, 22, 24 to limit the voltage across each cascode circuit during switching transients. Each of the clamp circuits 54, 56, 58, 60, 62, 64 includes the zener diode element CR1. Since the negative DC reference signal NEGDC is less than a voltage at the second switch output SSWOUT, the switching devices in the second cascode circuits 20, 22, 24 are N-channel devices rather than P-channel devices, and the control transistor elements are P-channel devices rather than N-channel devices. Each of the second cascode circuits 20, 22, 24 includes a second P-channel FET element 68 and a second N-channel FET element 70. The source of the second P-channel FET element 68 provides the control output CNTOUT, and the source of the second N-channel FET element 70 provides the switching input SWIN. The gate of the second N-channel FET element 70 is coupled to the drain of the second P-channel FET element 68, which provides the control input CNTIN. The gate of the second P-channel FET element 68 is coupled to the drain of the second N-channel FET element 70, which provides the switching output SWOUT. The second FET elements 68, 70 are coupled in a cascode arrangement. The second bias circuit 66 provides the appropriate second output end control signal SOECS relative to the second switching output SSWOUT for both the closed state and open state of the second cascode switch 18.

Figure 9:
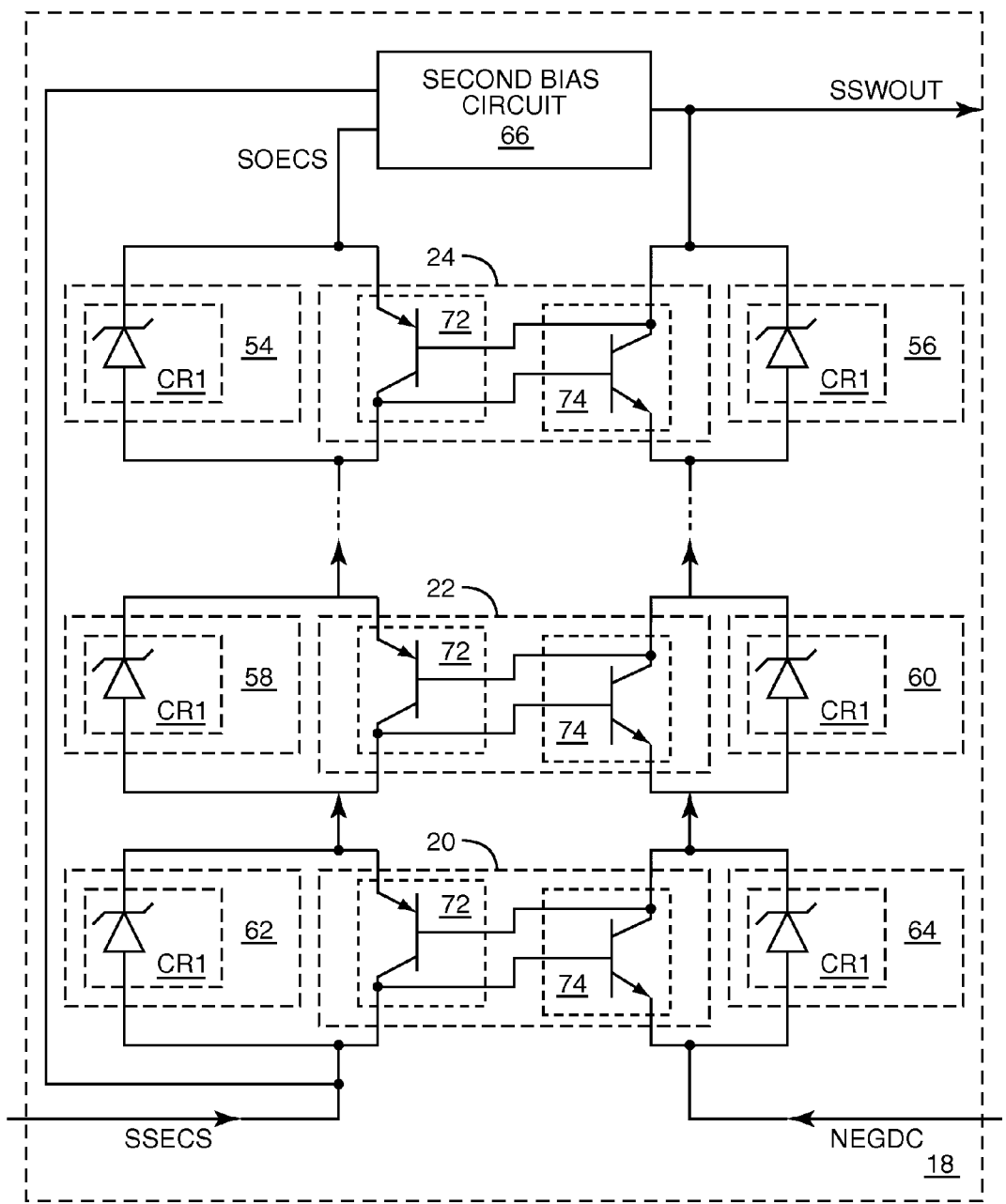
FIG. 9 shows an alternate embodiment of the second cascode circuits illustrated in FIG. 8.

FIG. 9 shows an alternate embodiment of the second cascode circuits 20, 22, 24 illustrated in FIG. 8. Each of the second cascode circuits 20, 22, 24 includes a second PNP bipolar transistor element 72 and a second NPN bipolar transistor element 74 coupled in a cascode arrangement. An emitter of the second PNP bipolar transistor element 72 provides the control output CNTOUT, and an emitter of the second NPN bipolar transistor element 74 provides the switching input SWIN. A base of the second PNP bipolar transistor element 72 is coupled to the collector of the second NPN bipolar transistor element 74, which provides the switching output SWOUT. The base of the second NPN bipolar transistor element 74 is coupled to the collector of the second PNP bipolar transistor element 72, which provides the control input CNTIN.

Figure 10:
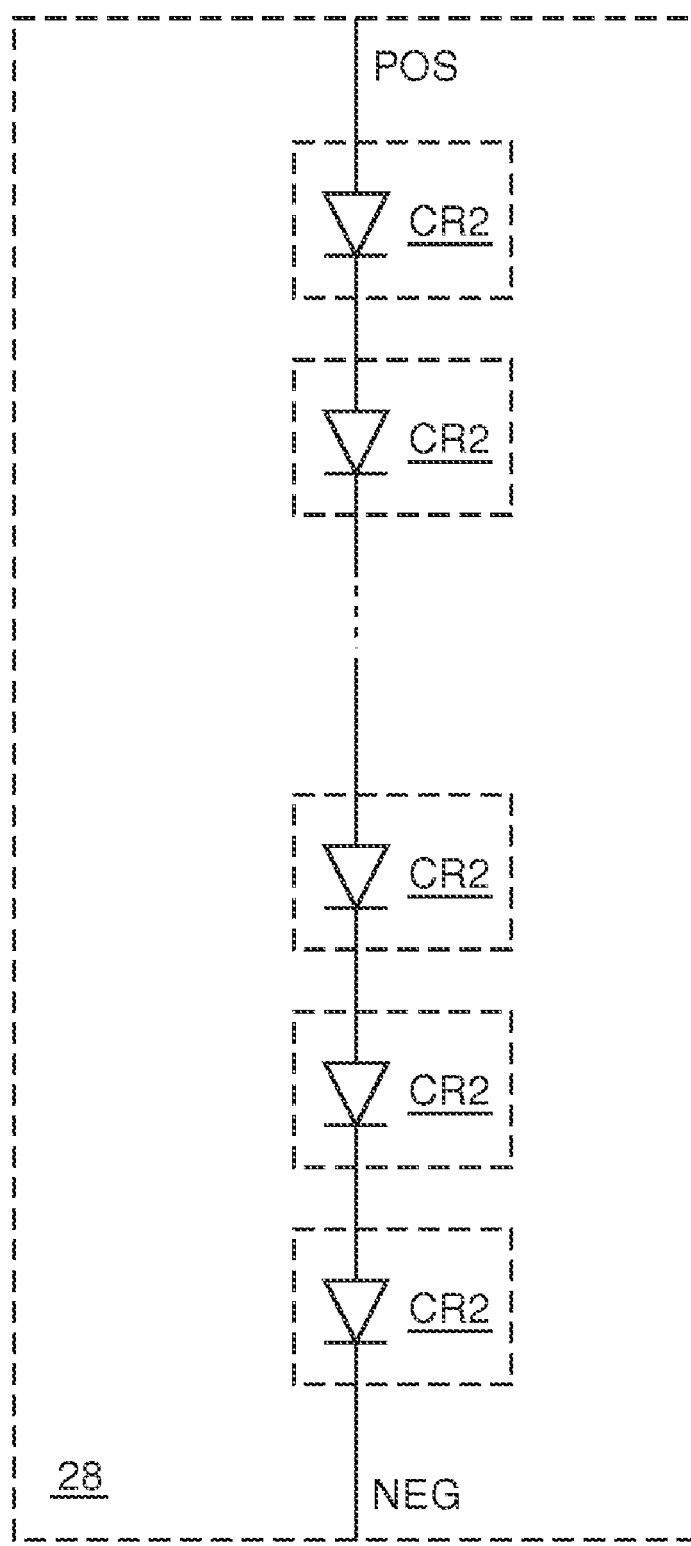
FIG. 10 shows a second embodiment of the clamp circuits illustrated in FIGS. 5 and 8.

FIG. 10 shows a second embodiment of the clamp circuits 28, 30, 32, 34, 36, 38, 54, 56, 58, 60, 62, 64 illustrated in FIGS. 5 and 8. For clarity, the second embodiment is labeled as 28. Multiple diode elements CR2 are coupled in series such that an anode of one diode element CR2 is coupled to a cathode of another diode element CR2 to form a chain. A cathode of a diode element CR2 at one end of the chain is coupled to the negative input NEG, and an anode of a diode element CR2 at the other end of the chain is coupled to the positive input POS. In an exemplary embodiment of the present invention, the chain includes nine diode elements CR2.

Figure 11:
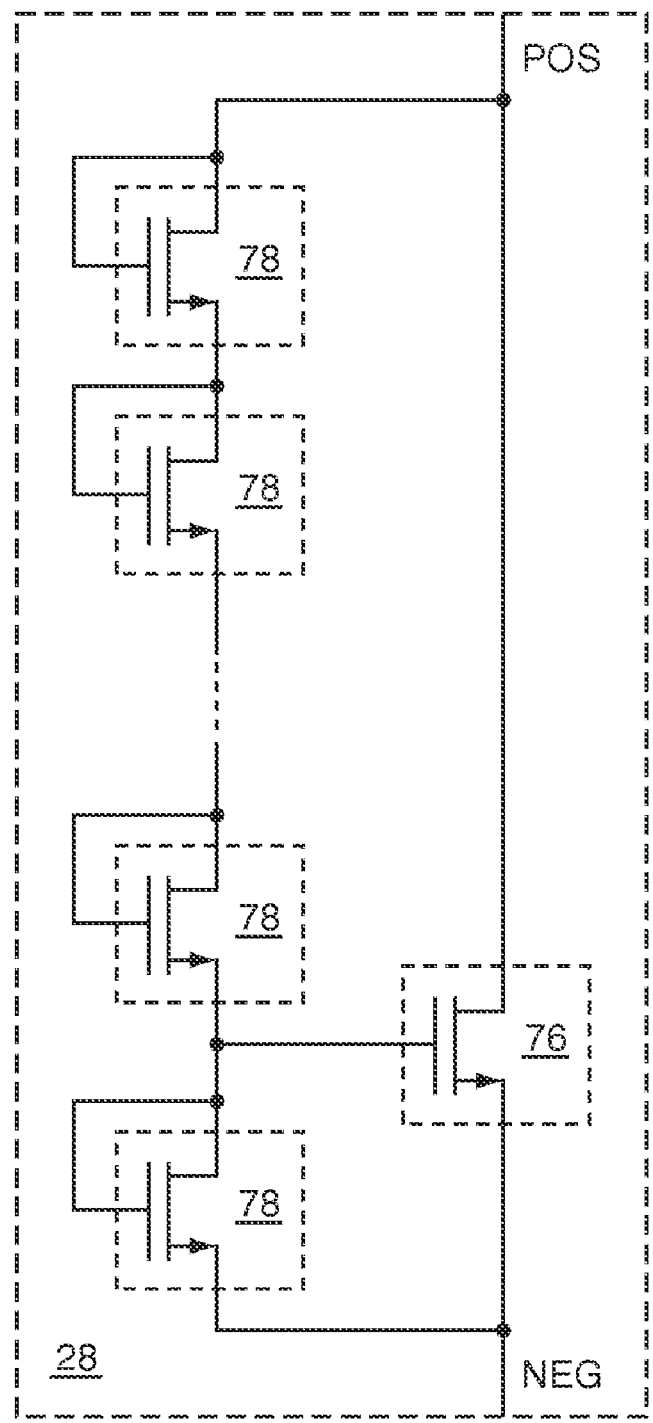
FIG. 11 shows a third embodiment of the clamp circuits illustrated in FIGS. 5 and 8.

FIG. 11 shows a third embodiment of the clamp circuits 28, 30, 32, 34, 36, 38, 54, 56, 58, 60, 62, 64 illustrated in FIGS. 5 and 8. For clarity, the third embodiment is labeled as 28. Each of the clamp circuits 28, 30, 32, 34, 36, 38, 54, 56, 58, 60, 62, 64 may include a first N-channel clamp FET element 76 and multiple N-channel clamp FET elements 78 coupled in series. The drain of the first N-channel clamp FET elements 76 provides the positive input POS and the source of the first N-channel clamp FET element 76 provides the negative input NEG. The multiple N-channel clamp FET elements 78 are coupled in series to form a chain, such that a source of one of the multiple N-channel clamp FET elements 78 is coupled to the source of the first N-channel clamp FET element 76, and a drain of one of the multiple N-channel clamp FET elements 78 at the other end of the chain is coupled to the drain of the first N-channel clamp FET element 76. The gate of each of the multiple N-channel clamp FET elements 78 is coupled to its drain, and the chain is formed by coupling the source of one of the multiple N-channel clamp FET elements 78 to the drain of another of the multiple N-channel clamp FET elements 78. The gate of the first N-channel clamp FET element 76 is coupled to the drain of the N-channel clamp FET element 78 on one end of the chain nearest the negative input NEG. In an exemplary embodiment of the present invention, the chain includes six N-channel clamp FET elements 78. In one embodiment of the present invention, the first N-channel clamp FET element 76, the multiple N-channel clamp FET elements 78, or both may be MOSFET elements. The N-channel clamp FET elements 76, 78 may be used in those clamp circuits 28, 32, 36, 56, 60, 64 that are coupled to first or second N-channel FET elements 42, 70.

Figure 12:
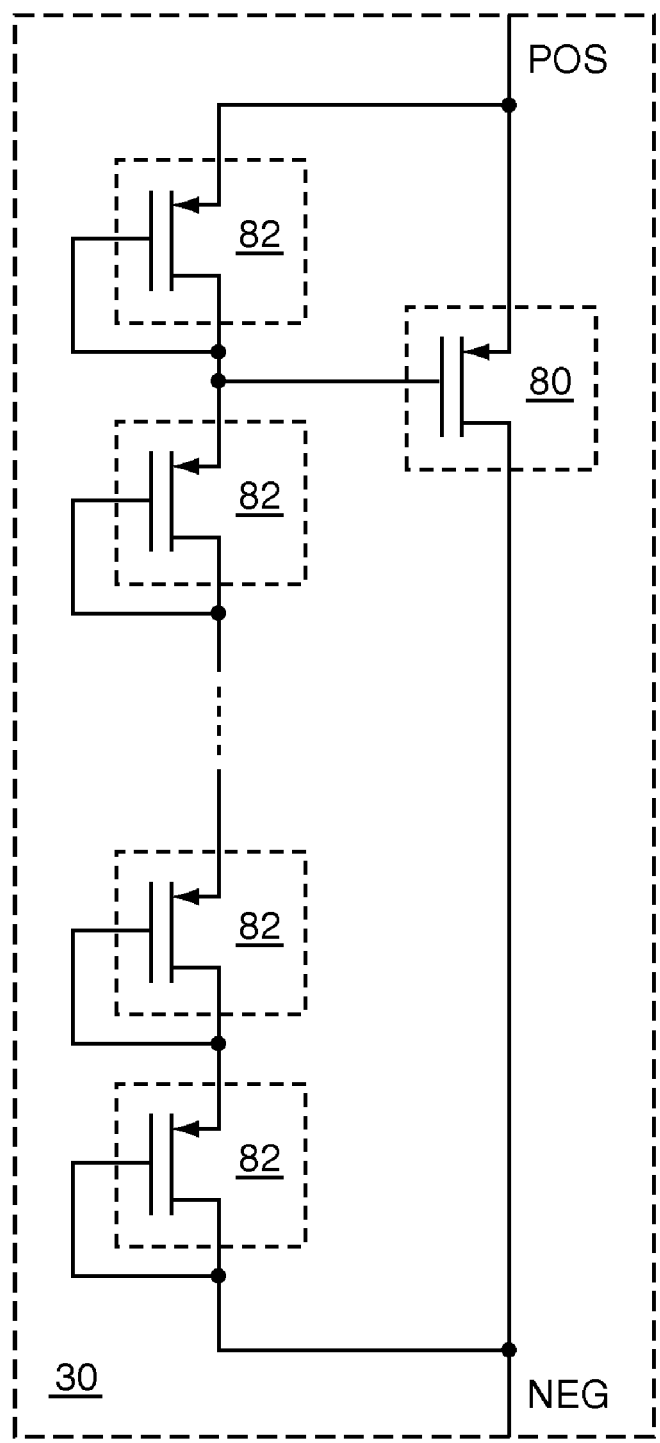
FIG. 12 shows a fourth embodiment of the clamp circuits illustrated in FIGS. 5 and 8.

FIG. 12 shows a fourth embodiment of the clamp circuits 28, 30, 32, 34, 36, 38, 54, 56, 58, 60, 62, 64 illustrated in FIGS. 5 and 8. For clarity, the fourth embodiment is labeled as 30. Each of the clamp circuits 28, 30, 32, 34, 36, 38, 54, 56, 58, 60, 62, 64 may include a first P-channel clamp FET element 80 and multiple P-channel clamp FET elements 82 coupled in series to form a chain. The source of the first P-channel clamp FET element 80 provides the positive input POS, and the drain of the first P-channel clamp FET element 80 provides the negative input NEG. The source of one of the multiple P-channel clamp FET elements 82 at the end of the chain is coupled to the source of the first P-channel clamp FET element 80. The drain of the one of the multiple P-channel clamp FET elements 82 at the other end of the chain is coupled to the drain of the first P-channel clamp FET element 80. The gate of each of the multiple P-channel clamp FET elements 82 is coupled to its drain. The drain of one of the multiple P-channel clamp FET elements 82 is coupled to the source of another of the multiple P-channel clamp FET elements 82 to form the chain. The gate of the first P-channel clamp FET element 80 is coupled to the drain of the P-channel clamp FET element 82 that is at the end of the chain closest to the positive input POS. In one embodiment of the present invention, the first and multiple P-channel clamp FET elements 80, 82 are MOSFET elements. In an exemplary embodiment of the present invention, the chain includes five P-channel clamp FET elements 82 coupled in series. The first and multiple P-channel clamp FET elements 80, 82 may be used in those clamp circuits 30, 34, 38, 54, 58, 62 that are coupled to first and second P-channel FET elements 44, 68.

Figure 13:
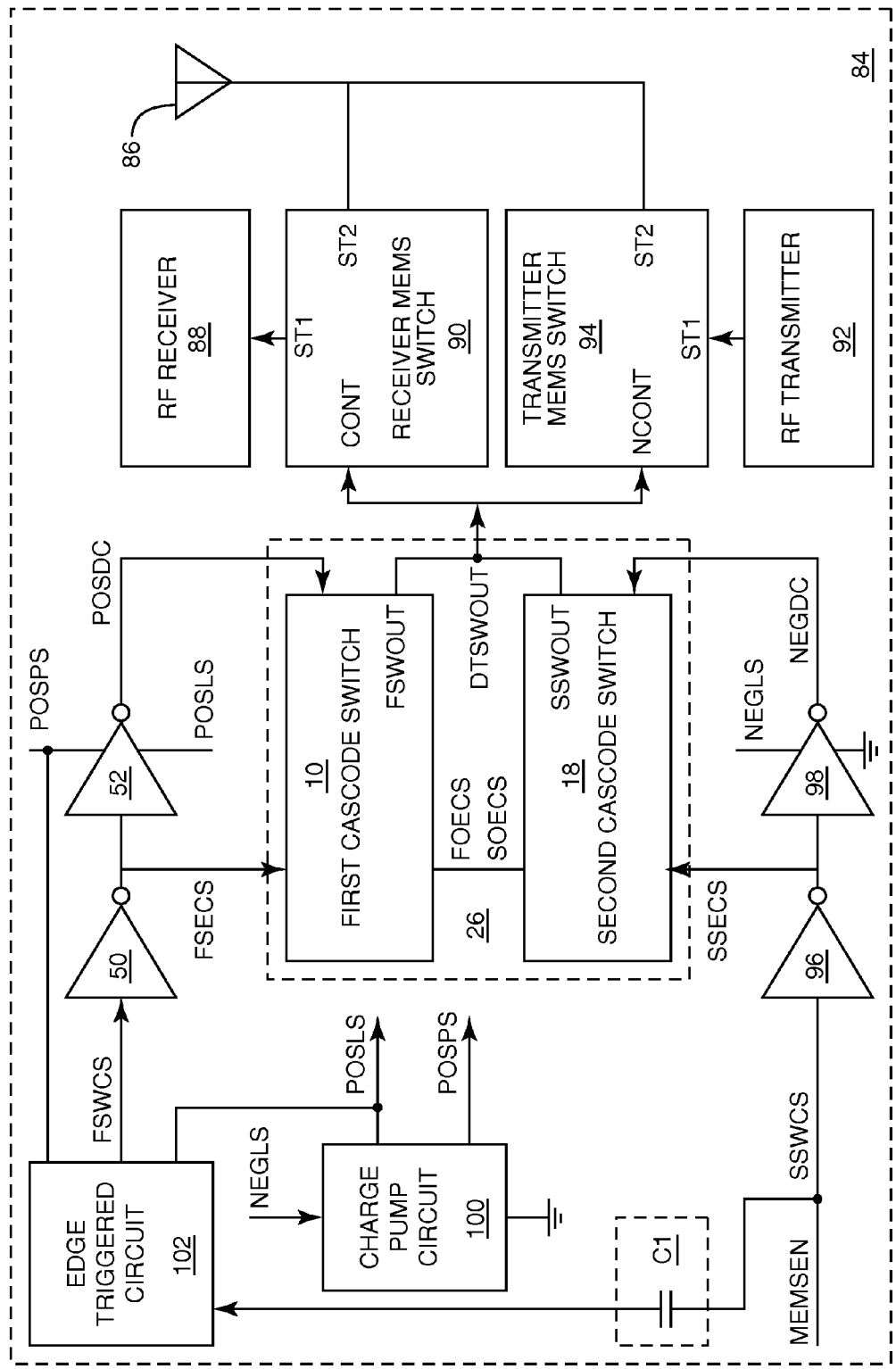
FIG. 13 shows the double-throw cascode switch used in an RF transceiver.

FIG. 13 shows the double-throw cascode switch 26 used in an RF transceiver 84. The RF transceiver 84 includes an antenna 86 that is coupled to an RF receiver 88 through a receiver MEMS switch 90, and an RF transmitter 92 through a transmitter MEMS switch 94. Each of the MEMS switches 90, 94 has a first switch terminal ST1 and a second switch terminal ST2, which are coupled together when one of the MEMS switches 90, 94 is in a closed state and are isolated from each other when one of the MEMS switches 90, 94 is in an open state. A MEMS enable signal MEMSEN provides a second switch control signal SSWCS to a third inverter 96, which provides the second supply end control signal SSECS and feeds a fourth inverter 98. The third and fourth inverters 96, 98 are powered from a negative DC logic supply signal NEGLS, and the fourth inverter 98 provides the negative DC reference signal NEGDC. The double-throw cascode switch 26 provides a signal from the double-throw switch output DTSWOUT that feeds a MEMS control input CONT of the receiver MEMS switch 90 and a MEMS inverted control input NCONT of the transmitter MEMS switch 94. When the signal from the double-throw switch output DTSWOUT is in a high state, the receiver MEMS switch 90 is in a closed state and the transmitter MEMS switch 94 is in an open state. When the signal from the double-throw switch output DTSWOUT is in a low state, the receiver MEMS switch 90 is in an open state and the transmitter MEMS switch 94 is in a closed state. A charge pump circuit 100 uses the negative DC logic supply signal NEGLS to generate the positive DC power supply signal POSPS and the positive DC logic supply signal POSLS. The MEMS enable signal MEMSEN feeds an edge triggered circuit 102 through a capacitive element C1. When the MEMS enable signal MEMSEN is driven to a high state, the first and second switch control signals FSWCS, SSWCS are driven to their respective high states, which drives the first and second supply end control signals FSECS, SSECS to their respective low states, driving the positive and negative DC reference signals POSDC, NEGDC to their respective high states, which puts the first cascode switch 10 in its closed state and the second cascode switch 18 in its open state, driving the double-throw switch output DTSWOUT to its high state. When the MEMS enable signal MEMSEN is driven to its low state, the first and second switch control signals FSWCS, SSWCS are driven to their respective low states, which drives the first and second supply end control signals FSECS, SSECS to their respective high states, driving the positive and negative DC reference signals POSDC, NEGDC to their respective low states, which puts the first cascode switch 10 in its open state and the second cascode switch 18 in its closed state, driving the double-throw switch output DTSWOUT to its low state. In one embodiment of the present invention, a voltage of the negative DC logic supply signal NEGLS is between three volts DC and seven volts DC above ground. In an exemplary embodiment of the present invention, the voltage of the negative DC logic supply signal NEGLS is approximately five volts DC above ground.

Figure 14:
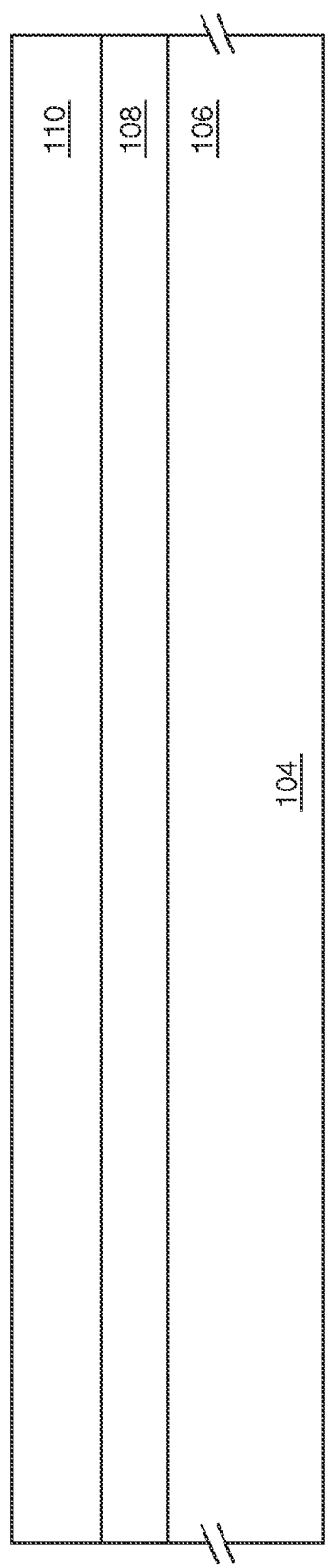
FIG. 14 shows an SOI wafer.

FIG. 14 shows an SOI wafer 104. In one embodiment of the present invention, the SOI wafer 104 has a substrate 106, an insulator layer 108 over the substrate 106, and a silicon device layer 110 over the insulator layer 108.

Figure 15:
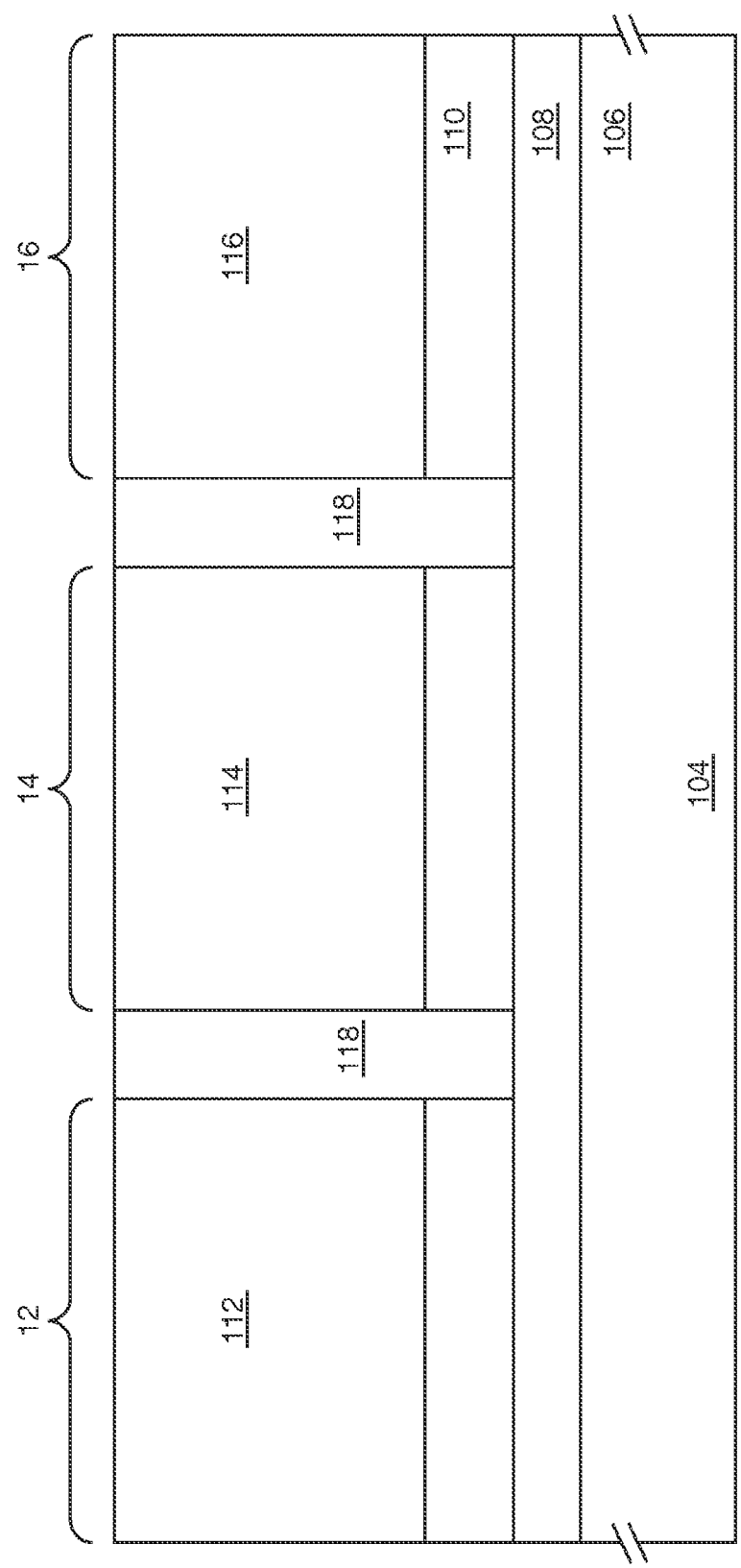
FIG. 15 shows the first cascode circuits provided by the SOI wafer.

FIG. 15 shows the first cascode circuits 12, 14, 16 provided by the SOI wafer 104. A first epitaxial structure 112, a second epitaxial structure 114, and a third epitaxial structure 116 are formed over the silicon device layer 110. The second epitaxial structure 114 is isolated from the first epitaxial structure 112 and the third epitaxial structure 116 by isolation trenches 118. The first, second, and third epitaxial structures 112, 114, 116 provide the first supply end cascode circuit 12, the first middle cascode circuit 14, and the first output end cascode circuit 16, respectively. In one embodiment of the present invention, the insulator layer 108 includes Silicon Dioxide. In an alternate embodiment of the present invention, the insulator layer 108 includes Sapphire.

Those skilled in the art will recognize improvements and modifications to the preferred embodiments of the present invention. All such improvements and modifications are considered within the scope of the concepts disclosed herein and the claims that follow.

What is claimed is:

1. A switching circuit comprising:
   a first supply end cascode circuit comprising:
      a first supply end switching input coupled to a first direct current (DC) reference;
      a first supply end control input adapted to receive a first supply end control signal;
      a first supply end switching output; and
      a first supply end control output; and
   a first output end cascode circuit comprising:
      a first output end switching input coupled to the first supply end switching output;
      a first output end control input coupled to the first supply end control output;
      a first output end switching output coupled to a first switch output; and
      a first output end control output adapted to receive a first output end control signal,
   wherein the first supply end and first output end cascode circuits are switched from a first open state to a first closed state based on the first output end and first supply end control signals.

2. The switching circuit of claim 1 further comprising at least one first intermediate cascode circuit coupled in series between the first supply end cascode circuit and the first output end cascode circuit, such that the at least one first intermediate cascode circuit, the first supply end cascode circuit, and the first output end cascode circuit provide a first cascode switch.

3. The switching circuit of claim 2 wherein:
   during the first closed state, a first on impedance is presented between the first switch output and the first DC reference;
   during the first open state, a first off impedance is presented between the first switch output and the first DC reference; and
   during the first open state, a voltage between the first switch output and the first DC reference is divided across the first supply end cascode circuit, the at least one first intermediate cascode circuit, and the first output end cascode circuit based on an off impedance of each of the first supply end, the at least one first intermediate, and the first output end cascode circuits.

4. The switching circuit of claim 2 further comprising:
   a second supply end cascode circuit comprising:
      a second supply end switching input coupled to a second DC reference; and
      a first supply end control input adapted to receive a second supply end control signal;
   a second output end cascode circuit comprising:
      a second output end switching output coupled to a second switch output; and
      a second output end control output adapted to receive a second output end control signal; and
   at least one second intermediate cascode circuit coupled in series between the second supply end cascode circuit and the second output end cascode circuit, wherein the at least one second intermediate cascode circuit, the second supply end cascode circuit, and the second output end cascode circuit provide a second cascode switch, and the second cascode switch is in one of a second open state and a second closed state based on the second output end and second supply end control signals.

5. The switching circuit of claim 4 wherein:
   the first switching output is coupled to the second switching output;
   a double-throw switch output is coupled to the first switching output;
   the first output end control output provides the second output end control signal;
   the second output end control output provides the first output end control signal;
   the first open state is approximately concurrent with the second closed state; and
   the second open state is approximately concurrent with the first closed state.

6. The switching circuit of claim 2 further comprising a bias circuit coupled to the first switch output, such that the bias circuit is adapted to:
   receive the first supply end control signal; and
   provide the first output end control signal based on the first supply end control signal and the first switch output.

7. The switching circuit of claim 2 further comprising a plurality of switching side clamp circuits wherein:
   each of the plurality of switching side clamp circuits has a first switching clamp input and a second switching clamp input;
   when a voltage difference between the first switching clamp input and the second switching clamp input exceeds a switching side breakdown voltage, the each of the plurality of switching side clamp circuits is in a switching side clamping state;
   when the voltage difference between the first switching clamp input and the second switching clamp input is less than a switching side maximum operating voltage, the each of the plurality of switching side clamp circuits is in a switching side non-clamping state;

a first of the plurality of switching side clamp circuits is coupled between the first supply end switching input and the first supply end switching output;

a second of the plurality of switching side clamp circuits is coupled between the first output end switching input and the first output end switching output; and a switching side of each of the at least one first intermediate cascode circuit is coupled to a corresponding one of the plurality of switching side clamping circuits.

8. The switching circuit of claim 2 further comprising a plurality of control side clamp circuits wherein:

each of the plurality of control side clamp circuit has a first control clamp input and a second control clamp input;

when a voltage difference between the first control clamp input and the second control clamp input exceeds a control side breakdown voltage, the each of the plurality of control side clamp circuits is in a control side clamping state;

when the voltage difference between the first control clamp input and the second control clamp input is less than a control side maximum operating voltage, the each of the plurality of control side clamp circuits is in a control side non-clamping state;

a first of the plurality of control side clamp circuits is coupled between the first supply end control input and the first supply end control output;

a second of the plurality of control side clamp circuits is coupled between the first output end control input and the first output end control output; and a control side of each of the at least one first intermediate cascode circuit is coupled to a corresponding one of the plurality of control side clamping circuits.

9. The switching circuit of claim 8 further comprising a plurality of switching side clamp circuits wherein:

each of the plurality of switching side clamp circuits has a first switching clamp input and a second switching clamp input;

when a voltage difference between the first switching clamp input and the second switching clamp input exceeds a switching side breakdown voltage, the each of the plurality of switching side clamp circuits is in a switching side clamping state;

when the voltage difference between the first switching clamp input and the second switching clamp input is less than a switching side maximum operating voltage, the each of the plurality of switching side clamp circuits is in a switching side non-clamping state;

a first of the plurality of switching side clamp circuits is coupled between the first supply end switching input and the first supply end switching output;

a second of the plurality of switching side clamp circuits is coupled between the first output end switching input and the first output end switching output; and a switching side of each of the at least one first intermediate cascode circuit is coupled to a corresponding one of the plurality of switching side clamping circuits.

10. The switching circuit of claim 9 wherein:

each of the plurality of switching side clamp circuits further comprises a switching side plurality of series coupled diode elements that form a switching side chain, such that:

a series coupling of the switching side plurality of series coupled diode elements comprises coupling an anode of one of the switching side plurality of series coupled diode elements to a cathode of another of the switching side plurality of series coupled diode elements;

an anode of a series coupled diode element at an end of the switching side chain is coupled to the first switching clamp input; and a cathode of a series coupled diode element at an opposite end of the switching side chain is coupled to the second switching clamp input; and each of the plurality of control side clamp circuits further comprises a control side plurality of series coupled diode elements that form a control side chain, such that:

a series coupling of the control side plurality of series coupled diode elements comprises coupling an anode of one of the control side plurality of series coupled diode elements to a cathode of another of the control side plurality of series coupled diode elements;

an anode of a series coupled diode element at an end of the control side chain is coupled to the first control clamp input; and a cathode of a series coupled diode element at an opposite end of the control side chain is coupled to the second control clamp input.

11. The switching circuit of claim 9 wherein:

each of the plurality of switching side clamp circuits further comprises a switching side zener diode element, such that a cathode of the switching side zener diode element is coupled to the first switching clamp input, and an anode of the switching side zener diode element is coupled to the second switching clamp input; and each of the plurality of control side clamp circuits further comprises a control side zener diode element, such that a cathode of the control side zener diode element is coupled to the first control clamp input, and an anode of the control side zener diode element is coupled to the second control clamp input.

12. The switching circuit of claim 9 wherein:

each of the plurality of switching side clamp circuits further comprises one of an N-channel switching side clamping circuit and a P-channel switching side clamping circuit;

the N-channel switching side clamping circuit comprises:

a first N-channel switching field effect transistor (FET) element, such that a drain of the first N-channel switching FET element is coupled to the first switching clamp input, and a source of the first N-channel switching FET element is coupled to the second switching clamp input; and a switching side plurality of series coupled N-channel switching FET elements that form a first switching side chain, such that:

the first switching side chain comprises coupling a source of one of the switching side plurality of series coupled N-channel switching FET elements to a drain of another of the switching side plurality of the series coupled N-channel switching FET elements;

a gate of each of the switching side plurality of series coupled N-channel switching FET elements is coupled to a drain of the each of the switching side plurality of series coupled N-channel switching FET elements;

a drain of a series coupled N-channel switching FET element at an end of the first switching side chain is coupled to the first switching clamp input;

a source of a series coupled N-channel switching FET element at an opposite end of the first switching side chain is coupled to the second switching clamp input; and a gate of the series coupled N-channel switching FET element at the opposite end of the first switching side chain is coupled to a gate of the first N-channel switching FET element;

the P-channel switching side clamping circuit comprises:

a first P-channel switching FET element, such that a drain of the first P-channel switching FET element is coupled to the second switching clamp input, and a source of the first P-channel switching FET element is coupled to the first switching clamp input; and a switching side plurality of series coupled P-channel switching FET elements that form a second switching side chain, such that:

the second switching side chain comprises coupling a source of one of the switching side plurality of series coupled P-channel switching FET elements to a drain of another of the switching side plurality of the series coupled P-channel switching FET elements;

a gate of each of the switching side plurality of series coupled P-channel switching FET elements is coupled to a drain of the each of the switching side plurality of series coupled P-channel switching FET elements;

a drain of a series coupled P-channel switching FET element at an end of the second switching side chain is coupled to the second switching clamp input;

a source of a series coupled P-channel switching FET element at an opposite end of the second switching side chain is coupled to the first switching clamp input; and a gate of the series coupled P-channel switching FET element at the opposite end of the second switching side chain is coupled to a gate of the first P-channel switching FET element;

each of the plurality of control side clamp circuits further comprises one of an N-channel control side clamping circuit and a P-channel control side clamping circuit;

the N-channel control side clamping circuit comprises:

a first N-channel control FET element, such that a drain of the first N-channel control FET element is coupled to the first control clamp input, and a source of the first N-channel control FET element is coupled to the second control clamp input; and a control side plurality of series coupled N-channel control FET elements that form a first control side chain, such that:

the first control side chain comprises coupling a source of one of the control side plurality of series coupled N-channel control FET elements to a drain of another of the control side plurality of the series coupled N-channel control FET elements;

a gate of each of the control side plurality of series coupled N-channel control FET elements is coupled to a drain of the each of the control side plurality of series coupled N-channel control FET elements;

a drain of a series coupled N-channel control FET element at an end of the first control side chain is coupled to the first control clamp input;

a source of a series coupled N-channel control FET element at an opposite end of the first control side chain is coupled to the second control clamp input; and a gate of the series coupled N-channel control FET element at the opposite end of the first control side chain is coupled to a gate of the first N-channel control FET element; and the P-channel control side clamping circuit comprises:

a first P-channel control FET element, such that a drain of the first P-channel control FET element is coupled to the second control clamp input, and a source of the first P-channel control FET element is coupled to the first control clamp input; and a control side plurality of series coupled P-channel control FET elements that form a second control side chain, such that:

the second control side chain comprises coupling a source of one of the control side plurality of series coupled P-channel control FET elements to a drain of another of the control side plurality of the series coupled P-channel control FET elements;

a gate of each of the control side plurality of series coupled P-channel control FET elements is coupled to a drain of the each of the control side plurality of series coupled P-channel control FET elements;

a drain of a series coupled P-channel control FET element at an end of the second control side chain is coupled to the second control clamp input;

a source of a series coupled P-channel control FET element at an opposite end of the second control side chain is coupled to the first control clamp input; and a gate of the series coupled P-channel control FET element at the opposite end of the second control side chain is coupled to a gate of the first P-channel control FET element.

13. The switching circuit of claim 9 wherein:

the control side maximum operating voltage is between three and seven volts DC;

the switching side maximum operating voltage is between three and seven volts DC;

the control side breakdown voltage is between four and nine volts DC; and the switching side breakdown voltage is between four and nine volts DC.

14. The switching circuit of claim 2 wherein the first supply end cascode circuit further comprises:

an N-channel field effect transistor (FET) element comprising a drain coupled to the first supply end control input, a source coupled to the first supply end control output, and a gate coupled to the first supply end switching output; and a P-channel FET element comprising a drain coupled to the first supply end switching output, a source coupled to the first supply end switching input, and a gate coupled to the first supply end control input.

15. The switching circuit of claim 2 wherein the first supply end cascode circuit further comprises:

a P-channel field effect transistor (FET) element comprising a drain coupled to the first supply end control input, a source coupled to the first supply end control output, and a gate coupled to the first supply end switching output; and an N-channel FET element comprising a drain coupled to the first supply end switching output, a source coupled to the first supply end switching input, and a gate coupled to the first supply end control input.

16. The switching circuit of claim 2 wherein the first supply end cascode circuit further comprises:
   an NPN bipolar transistor element comprising a collector coupled to the first supply end control input, an emitter coupled to the first supply end control output, and a base coupled to the first supply end switching output; and
   a PNP bipolar transistor element comprising a collector coupled to the first supply end switching output, an emitter coupled to the first supply end switching input, and a base coupled to the first supply end control input.

17. The switching circuit of claim 2 wherein the first supply end cascode circuit further comprises:
   a PNP bipolar transistor element comprising a collector coupled to the first supply end control input, an emitter coupled to the first supply end control output, and a base coupled to the first supply end switching output; and
   an NPN bipolar transistor element comprising a collector coupled to the first supply end switching output, an emitter coupled to the first supply end switching input, and a base coupled to the first supply end control input.

18. The switching circuit of claim 2 further comprising:
   a first inverter adapted to:
      receive a first switch control signal; and
      provide the first supply end control signal based on the first switch control signal; and
   a second inverter adapted to:
      receive the first supply end control signal; and
      provide the first DC reference based on the first supply end control signal.

19. The switching circuit of claim 18 wherein the first and second inverters are powered from a second DC reference and a third DC reference.

20. The switching circuit of claim 19 wherein at least one of the second DC reference and the third DC reference is provided by charge pump circuitry.

21. The switching circuit of claim 19 wherein a first voltage difference between the second DC reference and the third DC reference is between three and seven volts DC, and a second voltage difference between the second DC reference and ground is between 50 and 200 volts DC.

22. The switching circuit of claim 2 further comprising a silicon-on-insulator wafer that provides the first cascode switch.

23. The switching circuit of claim 22 wherein the silicon-on-insulator wafer has an insulator layer comprising Silicon Dioxide.

24. The switching circuit of claim 22 wherein the silicon-on-insulator wafer has an insulator layer comprising Sapphire.

25. The switching circuit of claim 22 wherein the at least one first intermediate cascode circuit, the first supply end cascode circuit, and the first output end cascode circuit are substantially electrically isolated from each other.

26. The switching circuit of claim 2 wherein the at least one first intermediate cascode circuit comprises at least four intermediate cascode circuits.

27. The switching circuit of claim 1 wherein the first supply end and first output end cascode circuits are switched from the first closed state to the first open state based on the first output end and first supply end control signals.

* * * * *